(12) United States Patent
Rajavi et al.

(10) Patent No.: US 9,800,249 B2
(45) Date of Patent: Oct. 24, 2017

(54) CURRENT STEERING PHASE CONTROL FOR CML CIRCUITS

(71) Applicant: QUALCOMM Incorporated, San Diego, CA (US)

(72) Inventors: Yashar Rajavi, Mountain View, CA (US); Jeongsik Yang, San Jose, CA (US); Emilia Vailun Lei, Union City, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/051,156

(22) Filed: Feb. 23, 2016

(65) Prior Publication Data

US 2017/0244415 A1 Aug. 24, 2017

(51) Int. Cl.
*H03K 21/00* (2006.01)
*H03K 23/00* (2006.01)
(Continued)

(52) U.S. Cl.
CPC ......... *H03K 21/026* (2013.01); *H03K 3/0372* (2013.01); *H03K 3/3562* (2013.01)

(58) Field of Classification Search
CPC ...... H03B 19/12; H03K 21/00; H03K 21/023; H03K 23/00; H03K 23/40; H03K 23/42;
(Continued)

(56) References Cited

U.S. PATENT DOCUMENTS 5,999,804 A * 12/1999 Forgues ............... H03D 7/1425
327/113
7,038,495 B2 5/2006 Choi
(Continued)

FOREIGN PATENT DOCUMENTS

CN 101888245 A 11/2010
EP 1170857 A2 1/2002

OTHER PUBLICATIONS

Miao G., et al., "A Fully-Integrated 10.5 to 13.5 Gbps Transceiver in 0.13μm CMOS," Custom Integrated Circuits Conference, IEEE, 2003, pp. 595-598.
(Continued)

*Primary Examiner* — Lincoln Donovan
*Assistant Examiner* — Diana J Cheng
(74) *Attorney, Agent, or Firm* — Patterson & Sheridan, L.L.P.

(57) ABSTRACT

The present disclosure describes current steering phase control for current-mode logic (CML) circuits. In some aspects, a circuit for frequency division comprises a current sink connected to a ground rail. The circuit also includes first and second current-carrying branches of frequency-dividing circuitry operably connected to respective load resistors, which are connected to a power rail. A first switch element of the circuit is connected between the current sink and the first current-carrying branch and a second switch element of the circuit is connected between the current sink and the second current-carrying branch. The first and second switch elements may steer current sank by the current sink between the first and second current-carrying branches effective to alter a phase of a signal provided by the frequency division circuit.

30 Claims, 8 Drawing Sheets

(51) Int. Cl.
  *H03K 25/00* (2006.01)
  *H03K 21/02* (2006.01)
  *H03K 3/3562* (2006.01)
  *H03K 3/037* (2006.01)

(58) Field of Classification Search
  CPC ........ H03K 25/00; H03K 27/00; H03K 29/00; H03L 7/148; H03L 7/18
  USPC .................................................. 327/113–120
  See application file for complete search history.

(56) References Cited

U.S. PATENT DOCUMENTS

| | | | |
|---|---|---|---|
| 7,336,114 B2* | 2/2008 | Razavi | H03K 3/012 327/199 |
| 7,348,818 B2* | 3/2008 | Hulfachor | H03B 19/14 327/147 |
| 8,362,820 B2 | 1/2013 | Deguchi et al. | |
| 8,704,559 B2 | 4/2014 | Fong et al. | |
| 8,829,954 B2 | 9/2014 | Taghivand et al. | |
| 9,356,768 B2 | 5/2016 | Lin et al. | |
| 2009/0195286 A1 | 8/2009 | Rylov | |
| 2010/0052803 A1 | 3/2010 | Ong et al. | |

OTHER PUBLICATIONS

Partial International Search Report—PCT/US2017/013653—ISA/EPO—dated May 8, 2017.

* cited by examiner

CURRENT STEERING PHASE CONTROL FOR CML CIRCUITS

BACKGROUND

Field of the Disclosure

This disclosure relates generally to current mode logic (CML) clock circuits, more specifically, to controlling phase of CML clock circuits.

Description of Related Art

This description of related art is provided for the purpose of generally presenting a context for the disclosure that follows. Unless indicated otherwise herein, concepts described in this section are not prior art to this disclosure and are not admitted to be prior art by inclusion herein.

Many electronic devices include a modem that enables communication of data via a wireless network. As users and applications of devices consume increasing amounts of data through the wireless networks, network providers and equipment manufacturers have implemented advanced communication techniques to increase spectrum efficiency. Many of these advanced techniques implement multiple-input multiple-output (MIMO) and carrier aggregation (CA), which increase wireless data capacity by using multiple spatial streams of communication.

To facilitate communication over multiple spatial streams, wireless transceivers include multiple transmit and receive chains to process data carried by each of the spatial streams. As with conventional transceivers, modulation and frequency conversion operations are performed using reference clock signals provided by a local oscillator (LO) and frequency dividers. With multiple transmit and receive chains, however, MIMO- and CA-capable transceivers often have a respective LO and frequency divider associated with each chain. Because an initial state of a frequency divider is unknown at start up, starting up multiple LOs and frequency dividers may result in out-of-phase LO signals. These out-of-phase LO signals often cause bi-modal direct current (DC) offset, which prevents some transmission operations, such as beam forming, or degrades receiver sensitivity.

SUMMARY

In some aspects, a circuit for frequency division comprises a current sink connected to a ground rail. The circuit also comprises a first current-carrying branch of frequency-dividing circuitry operably connected to a first load resistor and a second current-carrying branch of the frequency-dividing circuitry operably connected to a second load resistor, the load resistors being connected to a power rail. A first switch element is connected between the current sink and the first current-carrying branch and a second switch element is connected between the current sink and the second current-carrying branch. The first and second switch elements can steer current sank by the current sink between the first current-carrying branch or the second current-carrying branch effective to alter a phase of a signal provided by the frequency division circuit.

In other aspects, a frequency division circuit comprises first current-mode logic (CML) latch circuitry having outputs connected to a first potential via a first set of resistors and second CML latch circuitry having outputs connected to the first potential via a second set of resistors. The frequency division circuit further comprises first and second CML clock inputs having respective terminals connected to a second potential. A first set of switch elements of the circuit are interposed between another terminal of the first CML clock input and the first and second CML latch circuitry. A second set of switch elements of the circuit are interposed between another terminal of the second CML clock input and the first and second CML latch circuitry. The first and second sets of switch elements enable steering of current sank or sourced by the CML clock inputs through the first CML latch circuitry or the second CML latch circuitry.

In yet other aspects, a circuit for frequency division comprises first and second CML latches having respective latching branches, tracking branches with outputs connected to load resistors, and clock inputs connected to a ground rail. The circuit also comprises first switch elements connected from each of first CML latch's clock branches to the latching and tracking branches of the first CML latch, and second switch elements connected from the each of the second CML latch's clock branches to the latching and tracking branches of the second CML latch. The first and second switch elements enable steering of current sank by the respective clock branches between the latching and tracking branches of the CML latches. This can be effective to control a phase of a differential signal generated by the first and second CML latches.

In other aspects, a circuit for frequency division comprises a current sink connected to a ground rail. A first current-carrying branch of the circuit is operably connected to a first load resistor and a second current-carrying branch of the circuit is operably connected to a second load resistor, the load resistors being connected to a power rail. The circuit includes first means interposed between the current sink and the first current-carrying branch to selectively connect the current sink to the first current-carrying branch. The circuit also comprises second means interposed between the current sink and the second current-carrying branch to selectively connect the current sink to the second current-carrying branch.

BRIEF DESCRIPTION OF DRAWINGS

The details of various aspects are set forth in the accompanying figures and the detailed description that follows. In the figures, the left-most digit of a reference number identifies the figure in which the reference number first appears. The use of the same reference numbers in different instances in the description or the figures indicates like elements.

DETAILED DESCRIPTION

Figure 1:
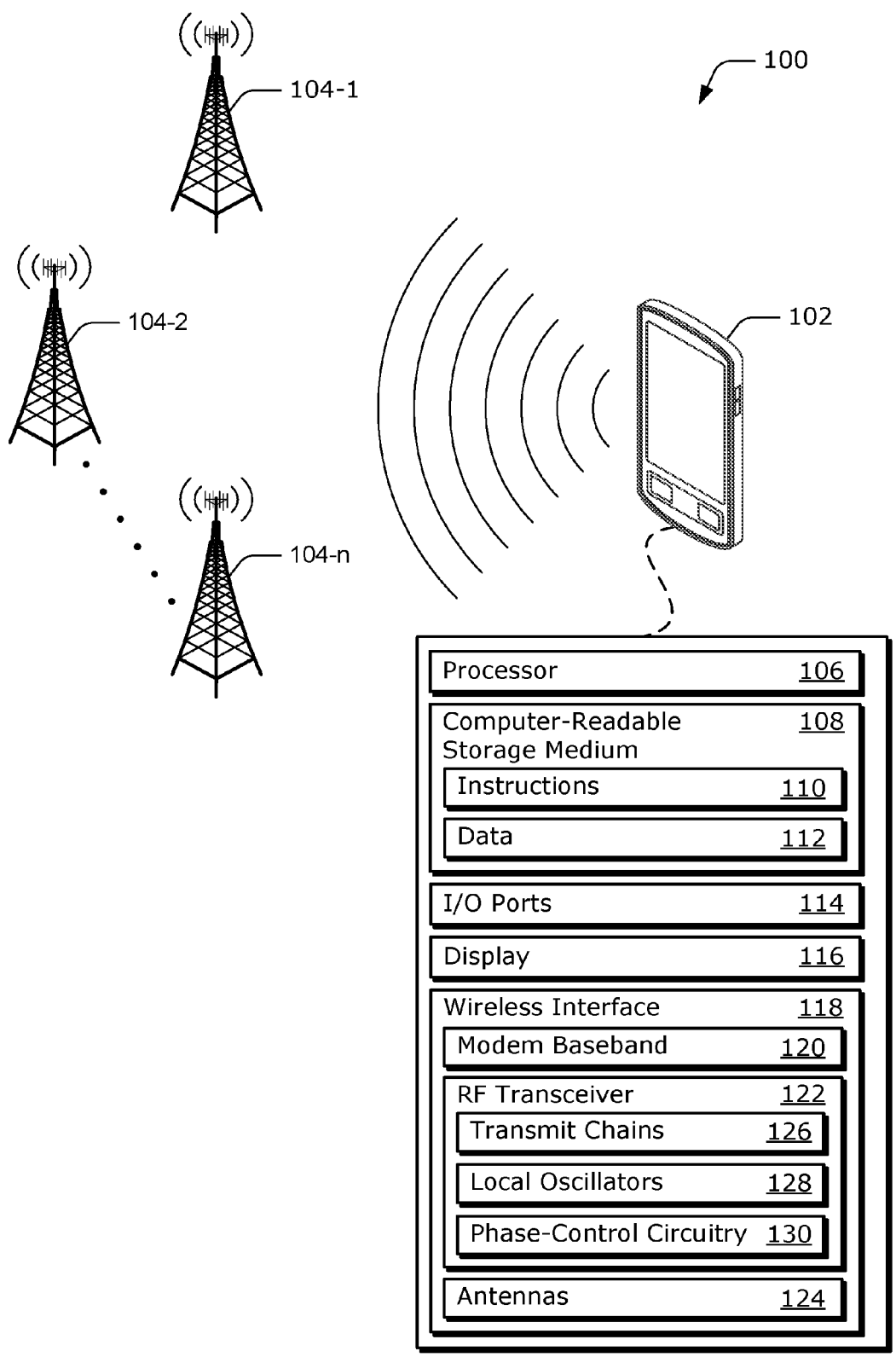
FIG. 1 illustrates an example environment that includes a computing device and wireless network.

Many modems implement advanced communication techniques, such as multiple-input multiple-output (MIMO) and carrier aggregation (CA) to increase spectrum efficiency and data rates. To do so, MIMO, CA, and others of these techniques may communicate data over multiple spatial streams or pipes of a wireless link. To process data communicated over multiple spatial streams, modem transceivers include multiple transmit and receive chains, through which data is encoded, modulated, and up-converted, or down-converted, demodulated, and decoded, respectively.

These operations performed by the receive or transmit chains use reference clock signals provided by a local oscillator (LO) and frequency dividers. With multiple transmit and receive chains, transceivers often have a respective LO and frequency divider associated with each chain. To enable advanced communication functions, such as beam forming, the multiple LOs and frequency dividers need to be phase aligned (e.g., same relative phase). Because starting states of the frequency dividers are unknown, however, phase detection and phase correction are often used when powering up the receive and transmit chains for calibration or operation.

Conventional phase correction is typically implemented by manipulating clock signals or multiplexing outputs of a frequency divider, both of which have associated drawbacks. For example, swallowing a clock pulse is difficult given short clock periods at higher frequencies and gating an input clock requires the addition of lossy transmission gates on the input. Alternately, different in-phase and quadrature (I/Q) paths created by output multiplexing circuits result in different residual side band (RSB) values that are difficult to account for and correct. As such, conventional phase correction can be difficult to implement, consume additional layout space, or increase design complexity.

This disclosure describes aspects of current steering phase control for current-mode logic (CML) circuits. The apparatuses and techniques described herein enable steering of current between current-carrying branches of frequency-dividing circuitry, which is effective to alter a phase of the frequency-dividing circuitry's output. Switch elements or paths that enable this current steering may require minimal layout space, add minimal design overheard, and operate without degrading performance of the frequency divider.

In some aspects of current steering phase control for CML circuits, a circuit for frequency division comprises a current sink connected to a ground rail to which current is sank. The circuit also includes first and second current-carrying branches operably connected to respective load resistors, which are connected to a power rail from which current is sourced. A first switch element of the circuit is connected between the current sink and the first current-carrying branch and a second switch element of the circuit is connected between the current sink and the second current-carrying branch. The first and second switch elements enable steering of current sank by the current sink between the first and second current-carrying branches effective to alter a phase of a signal provided by the circuit. By so doing, a phase of the signal can be corrected with minimal added circuitry and without degrading performance of the frequency divider.

These and other aspects of current steering phase control for CML circuits are described below in the context of an example environment, example current steering circuit, and techniques. Any reference made with respect to the example environment or circuit, or elements thereof, is by way of example only and is not intended to limit any of the aspects described herein.

Example Environment

FIG. 1 illustrates an example environment 100, which includes computing device 102. In this example, computing device 102 is implemented as a smart-phone. Although not shown, computing device 102 may be implemented as any suitable computing or electronic device, such as a modem, cellular base station, broadband router, access point, cellular phone, gaming device, navigation device, media device, laptop computer, desktop computer, server, network-attached storage (NAS) device, smart appliance, vehicle-based communication system, and the like. Computing device 102 communicates data via cell towers 104-1, 104-2, and/or 104-n, which may be configured to provide a wireless network. Although shown as three cell towers, cell towers 104-1 through 104-n may represent any suitable number of cell towers, where n is any suitable integer.

Cell towers 104 may communicate with computing device 102 by transferring a communication link between computing device 102 and cell towers 104, from one of the cell towers to another, commonly referred to as "handoff" of the communication link. In some aspects, other devices, such as a satellite, access point, wireless router, peer-to-peer device, mesh network node, or fiber-optic line, may provide an intermediate or alternate communication link for computing device 102 and/or cell towers 104. Therefore, computing device 102 may communicate with cell towers 104, or another device, via a wired connection, wireless connection, or a combination thereof.

Computing device 102 includes processor 106 and a computer-readable storage medium 108 (CRM 108). Processor 106 may include any type of processor, such as an application processor or multi-core processor, configured to execute processor-executable code stored by computer-readable storage medium 108. CRM 108 may include any suitable type of data storage media, such as volatile memory (e.g., random access memory (RAM)), non-volatile memory (e.g., Flash memory), optical media, magnetic media (e.g., disk or tape), and the like. In the context of this disclosure, CRM 108 is implemented to store data 112 and instructions 110 of computing device 102, and thus does not include transitory propagating signals or carrier waves.

Computing device 102 also includes input/output ports 114 (I/O ports 114), display 116, and wireless interface 118. I/O ports 114 enable data exchanges or interaction with other devices, networks, or users. I/O ports 114 may include serial ports (e.g., universal serial bus (USB) ports), parallel ports, audio ports, infrared (IR) ports, and the like. Display 116 presents graphics of computing device 102, such as a user interface associated with an operating system, program, or application.

Wireless interface 118 provides connectivity to respective networks and other electronic devices connected therewith. Alternately or additionally, computing device 102 may include a wired data interface, such as Ethernet or fiber optic interfaces for communicating over a local network, intranet, or the Internet. Wireless interface 118 may facilitate communication over any suitable type of wireless network, such as a wireless LAN, peer-to-peer (P2P), cellular network, and/or wireless personal-area-network (WPAN). In the context of the example environment, wireless interface 118 enables computing device 102 to communicate with cell towers 104.

Wireless interface 118 includes modem baseband 120 and radio frequency (RF) transceiver 122 to process data and/or signals associated with communicating data of computing device 102 over antennas 124. Modem baseband 120 may be implemented as a system-on-chip (SoC) that provides a digital communication interface for data, voice, messaging, and other applications of computing device 102. Modem baseband 120 may include a processor (not shown) to implement signal processing functions to enable wireless communication, such as frequency translation, encoding, decoding, modulation, and/or demodulation. Modem baseband 120 may also include baseband circuitry to perform high-rate sampling processes that can include analog-to-digital conversion, digital-to-analog conversion, gain correction, skew correction, frequency translation, and the like.

RF transceiver 122 includes circuitry and logic for frequency translation, which may be an up-conversion or down-conversion, performed in a single conversion, or through a plurality of conversion steps. For example, translation from an RF signal to a baseband signal may include a translation to an intermediate frequency (IF). Alternately or additionally, RF transceiver 122 may also include logic to perform in-phase/quadrature (I/Q) operations, such as synthesis, encoding, modulation, decoding, demodulation, and the like. RF transceiver 122 may be implemented with multiple or different sections to implement receiving and transmitting operations, which are described in detail below.

Modem baseband 120, RF transceiver 122, and antennas 124 can be configured to implement any suitable communication protocol or standard, such as a 3rd Generation Partnership Project (3GPP) protocol, Global System for Mobiles (GSM), Enhanced Data Rates for GSM (EDGE), Code Division Multiple Access (CDMA), CDMA 2000 (1×), Wideband CDMA, Time Division Synchronous CDMA (TD-SCDMA), Evolution-Data Optimized (EVDO), Universal Mobile Telecommunications System (UMTS), Long Term Evolution (LTE), LTE frequency division duplex (LTE-FDD), LTE time division duplex (LTE-TDD), LTE Advanced (LTE-A), Institute of Electrical and Electronics Engineers (IEEE) 802.11 standard, IEEE 802.16 standard and the like. In some aspects, these communication protocols or standards use multiple-input multiple-output (MIMO) or carrier aggregation (CA) technology to communicate (e.g., LTE and variants thereof). As such, modem baseband 120 and RF transceiver 122 are configurable for communication via multiple spatial streams or pipes comprising combinations of communication modes, carriers (e.g., channels), and frequency bands.

To facilitate the communication of signals or data via multiple spatial streams or pipes, RF transceiver 122 may include receive chains (not shown), transmit chains 126, and local oscillator 128. In some cases, local oscillator 128 may be implemented as a voltage-controlled oscillator (VCO) or phase-locked loop circuit. Each of the receive chains or transmit chains 126 may be associated with a respective local oscillator 128 or frequency divider (not shown) to implement in-phase/quadrature (I/Q) operations, such as synthesis, encoding, modulation, decoding, demodulation, and the like. To detect or correct phase of local oscillators 128, RF transceiver 122 includes phase detection (not shown) and phase-control circuitry 130, the implementation and use of which varies, and is described below in greater detail.

Figure 2:
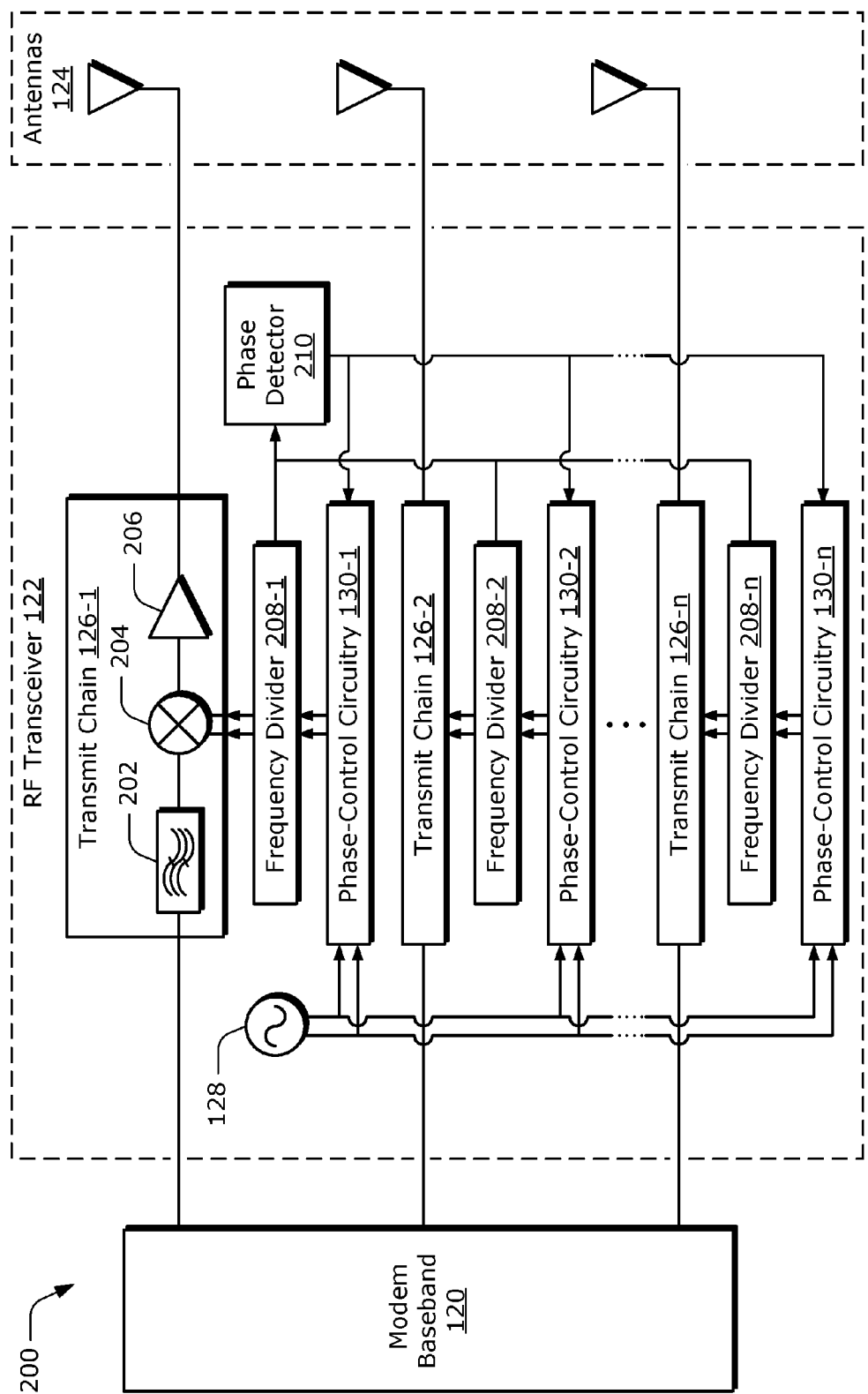
FIG. 2 illustrates an example configuration of the RF transceiver shown in FIG. 1.

FIG. 2 illustrates an example configuration of RF transceiver 122 generally at 200. In this particular example, modem baseband 120, RF transceiver 122, and antennas 124 are configured for MIMO communication to transmit multiple spatial streams of data. For example, RF transceiver 122 processes RF or intermediate frequency (IF) signals communicated in accordance with multiple communication protocols or standards, such as IEEE 802.11n, IEEE 802.11ac, WiMAX, LTE, and the like. In at least some aspects, RF transceiver 122 routes multiple RF signals concurrently to support MIMO, carrier aggregation, beam forming, or other advanced communication schemes.

RF transceiver 122 includes transmit chain 126-1 through 126-n, where n is any suitable integer. Although not shown, RF transceiver 122 may also include a similar number of receive chains being configured (e.g., structurally or functionally) to perform operations complementary to those of receive chains 126-1 through 126-n. For example, a signal path of a receive chain may include a low-noise amplifier to amplify received RF signals, a mixer to down-convert, based on an LO signal, the RF signals, and a baseband filter to filter analog signals sent to modem baseband 120.

In this example, transmit chain 126-1 includes baseband filter 202, mixer 204, and drive amplifier 206. Baseband filter 202 filters noise from a digital signal received from modem baseband 120. Mixer 204 up-converts, by use of an LO signal received from frequency divider 208-1, the digital signal into an RF signal. Here, frequency divider 208-2 operates as a differential divide-by-two divider to provide a differential LO signal at a frequency that is approximately half of a frequency at which oscillator 128 provides an input clock signal. Alternately or additionally, one or more frequency dividers may be configured as clock signal generators or repeaters. Drive amplifier 206 amplifies the RF signal for transmission by a respective one of antennas 124. Others of transmit chains 126 may be configured similarly, such as transmit chain 126-2 and 126-n, which are shown associated with frequency divider 208-2 and frequency divider 208-n, respectively.

As previously noted, powering or starting multiple local oscillators or frequency dividers may result in out-of-phase LO signals because the starting state of each frequency divider is unknown. To address this or other phase-related issues, RF transceiver also includes phase detector 210 and phase-control circuitry 130, which, in this example, is implemented as phase-control circuitry 130-1 through phase-control circuitry 130-n with each of transmit chain 126. In some cases, phase detector 210 and phase-control circuitry 130 determine and correct relative phase differences between frequency divider 208-1 through frequency divider 208-n to enable transceiver calibration operations or advanced communication functions, such as beam forming.

Phase detector 210 may use any suitable circuitry or techniques to determine phase of LO signals, such as mixer-based, sub-sampling, XOR-based, low-frequency sampling, and the like. Phase detector 210 can measure a relative phase difference between one or more frequency divider outputs to determine which frequency divider outputs are out-of-phase or un-aligned. In some cases, an output phase of an out-of-phase frequency divider is altered or aligned by phase-control circuitry 130, which is described in detail below.

Example Frequency Divider Circuit

Figure 3:
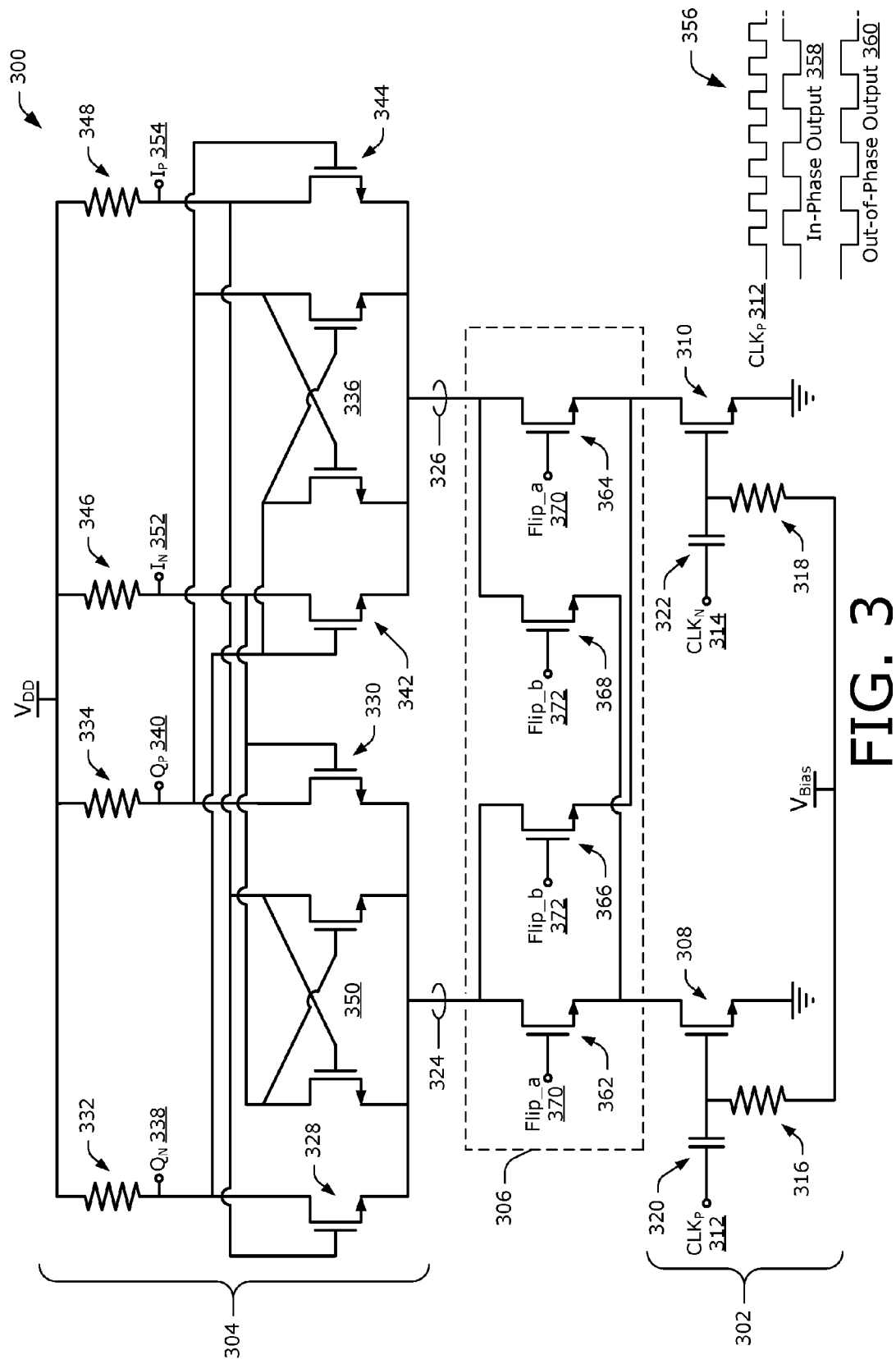
FIG. 3 illustrates an example frequency divider circuit in accordance with one or more embodiments.

FIG. 3 illustrates an example frequency divider circuit 300, which is configured as a divide-by-two CML divider having a master latch and a slave latch. Although described in reference to a divide-by-two architecture, the aspects and techniques herein can be applied to other divider configurations, such as divide-by-three, divide-by-four, divide-by-eight, and the like. In at least some cases, other divider configurations can be implemented by modifying and/or adding additional latches, switches, current paths, or logic gates to the circuitry described herein. In the following description, components of circuits may be connected (e.g., directly) or operably connected by one or more intervening components. Further, signal- or current-carrying structures of the circuits may be implemented as any suitable type of conductor, such as wires, printed-circuit board (PCB) traces, etched metal layers, contacts, nets, paths, rails, and the like. The use of these terms is not meant to limit configurations of any circuit, but to provide context for describing the circuits of the accompanying figures.

Frequency divider circuit 300 includes clock input circuitry 302 and latch circuitry 304, which are implemented as current-mode logic (CML) or source-coupled logic (SCL). CML dividers operate based on current flowing through different elements of a circuit and are suitable for high frequency signal processing. Although described in reference to sinking current, the circuits or aspects described herein may also be implemented by sourcing current through similar circuits, such as a circuit implemented with reversed power rails, inverted control signals, or complimentary transistor types. Frequency divider circuit 300 also includes current steering circuitry 306 connected between clock input circuitry 302 and latch circuitry 304. The use and implementation of current steering circuitry 306 varies and is described in detail below.

Clock input circuitry 302 includes clock input switch 308 and clock input switch 310, which are configured as differential inputs. Although shown as combined or shared clock inputs for both latches, other implementations of clock input circuitry may include separate differential input circuitry for each latch. Clock input switch 308 and clock input switch 310 can be implemented as any suitable switch, current source, or current sink, such as n-type or p-type metal-oxide-semiconductor field-effect transistors (MOSFETs). Respective control gates of clock input switch 308 and clock input switch 310 are connected to a differential signal, such as positive clock signal 312 ($CLK_P$ 312) and negative clock signal 314 ($CLK_N$ 314), respectively. Clock input switch 308 and clock input switch 310 sink current to ground or another lower potential based on the clocking signals applied at their respective control gates. Alternately, these clock input switches may source current from a power rail when circuit 300 is implemented in a reversed configuration (e.g., current-sourcing circuit). In the context of this disclosure, the respective current sinking outputs or lines of clock input switch 308 and clock input switch 310 may be referred to as clock branches.

As such, clock input switch 308 and clock input switch 310 alternately sink, based on differential clock signals $CLK_P$ 312 and $CLK_N$ 314, current from a respective terminal connected to higher-potential circuitry, such as portions of latch circuitry 304. Clock input circuitry 302 may also include bias resistor 316 and bias resistor 318 connected between the control gates of clock input switch 308 and clock input switch 310 and a bias voltage (e.g., $V_{BIAS}$) or another potential. Alternately or additionally, clock input circuitry 302 includes blocking capacitor 320 and blocking capacitor 322 connected to the gates of the clock inputs to block DC offset or noise of differential clock signals $CLK_P$ 312 and $CLK_N$ 314.

Latch circuitry 304 includes a portion of master latch circuitry and a portion of slave latch circuitry that are connected (or interconnected) in series and clocked by current-carrying branch 324 and current-carrying branch 326. Although shown as combined current-carrying branches for circuitry of both latches, other implementations of latch circuitry may include dedicated current-carrying branches for each clocking, tracking, and/or latching branch of a given latch.

In this particular example, the master latch circuitry includes a tracking branch that includes switch 328 and switch 330, which are connected to load resistor 332 and load resistor 334, respectively. As such, current-carrying branch 324 is operably connected to load resistors 332 and 334 via switches 328 and 330, respectively. The load resistors 332 and 334 are connected to a power rail (e.g., $V_{DD}$) or another potential that is higher than that of the latch circuitry of circuit 300. Thus, the switches 328 and 330 enable current to be sank from the power rail through load resistors 332 and 334 to provide an output voltage signal. The master latch circuitry also includes latching branch 336, which comprises cross-coupled switches having control gates connected to output 338 and output 340 of the tracking branch. As shown in FIG. 3, the outputs of the master tracking branch are labeled in terms of Q/I clock outputs, which include quadrature negative output 338 ($Q_N$ 338) and quadrature positive output 340 ($Q_P$ 340).

The slave latch circuitry includes a tracking branch that includes switch 342 and switch 344, which are connected to load resistor 346 and load resistor 348, respectively. As such, current-carrying branch 326 is operably connected to load resistors 346 and 348 via switches 342 and 344, respectively. The load resistors 346 and 348 are connected to the power rail or other potential that is higher than that of the latch circuitry of circuit 300. Thus, the switches 342 and 344 enable current to be sank from the power rail through load resistors 346 and 348 to provide an output voltage signal. The slave latch circuitry also includes latching branch 350, which comprises cross-coupled switches having control gates connected to output 352 and output 354 of the tracking branch. As shown in FIG. 3, the outputs of the slave tracking branch are also labeled in terms of Q/I clock outputs, which include in-phase negative output 352 ($I_N$ 352) and in-phase positive output 354 ($I_P$ 354). The switches of the master latch circuitry and slave latch circuitry may be implemented using any suitable types of switches, such as n-type or p-type MOSFETs.

In this particular example, the tracking and latching branches of each portion of latch circuitry 304 are clocked by a different one of current-carrying branch 324 and current-carrying branch 326. During operation of frequency divider circuit 300, current is alternately sank, based on $CLK_P$ 312 and $CLK_N$ 314, through either current branch by clock input switch 308 and clock input switch 310. By so doing, differential timing signals $Q_N$ 338, $Q_P$ 340, $I_N$ 352, and $I_P$ 354 are provided at the outputs of the tracking branches at half a frequency of $CLK_P$ 312. An example of this is shown at 356, where frequency divider circuit 300 provides in-phase output 358 or out-of-phase output 360 based on $CLK_P$ 312.

Because a starting state of slave latch's output is unknown at startup, outputs of frequency divider circuit 300 may be in-phase or out-of-phase. In at least some aspects, current steering circuitry 306 enables a phase of the output signals (e.g., $Q_N$ 338, $Q_P$ 340, $I_N$ 352, and $I_P$ 354) to be altered or adjusted (e.g., shifted) by steering current between current-carrying branch 324 and current-carrying branch 326. To do so, current steering circuitry 306 includes a first set of current paths that include switch element 362 and switch element 364, respectively. Current steering circuitry 306 includes a second set of current paths that include switch element 366 and switch element 368, respectively. Switch elements 362 through 368 may be implemented using any suitable type of switch or switching element, such as n-type or p-type MOSFETs. In some cases, selecting the first set or second set of current paths to carry current between the latch circuitry and the clock input circuitry is effective to shift or flip a phase of an input signal applied to the frequency divider circuit.

Although implemented as four current paths (e.g., conductive paths) between clock input circuitry 302 and latch circuitry 304, current steering circuitry 306 may be implemented using any suitable number of current paths and/or switches. In at least some aspects, these switches provide means for steering current between different sets of current paths. For example, when clock input circuitry 302 and latch circuitry 304 are implemented as separate latches (e.g., four clock inputs, four current-carrying branches, four clock branches), current steering circuitry 306 may be implemented as eight current paths selectable by eight switch elements. This is but one alternate implementation of current steering circuitry, others of which may include any suitable number of current paths or switch elements.

In this particular example, current steering circuitry 306 is controlled by asserting phase flip signal 370 (flip_a 370) or alternate phase flip signal 372 (flip_b 372) to activate the associated switch elements. By so doing, respective current of clock input switch 308 and clock input switch 310 can be sank through a different one of current-carrying branch 324 and current-carrying branch 326 to shift or flip a phase of the input signal by 180 degrees. With the frequency division provided by latch circuitry 304, flipping the input signal by 180 degrees can be effective to shift a phase of the output signals by 90 degrees. To shift the output of frequency divider circuit 300 by more than 90 degrees, timing an application of phase flip signal 370 or alternate phase flip signal 372 may be adjusted to occur in consecutive +90-degree or −90-degree regions of output phase.

Figure 4:
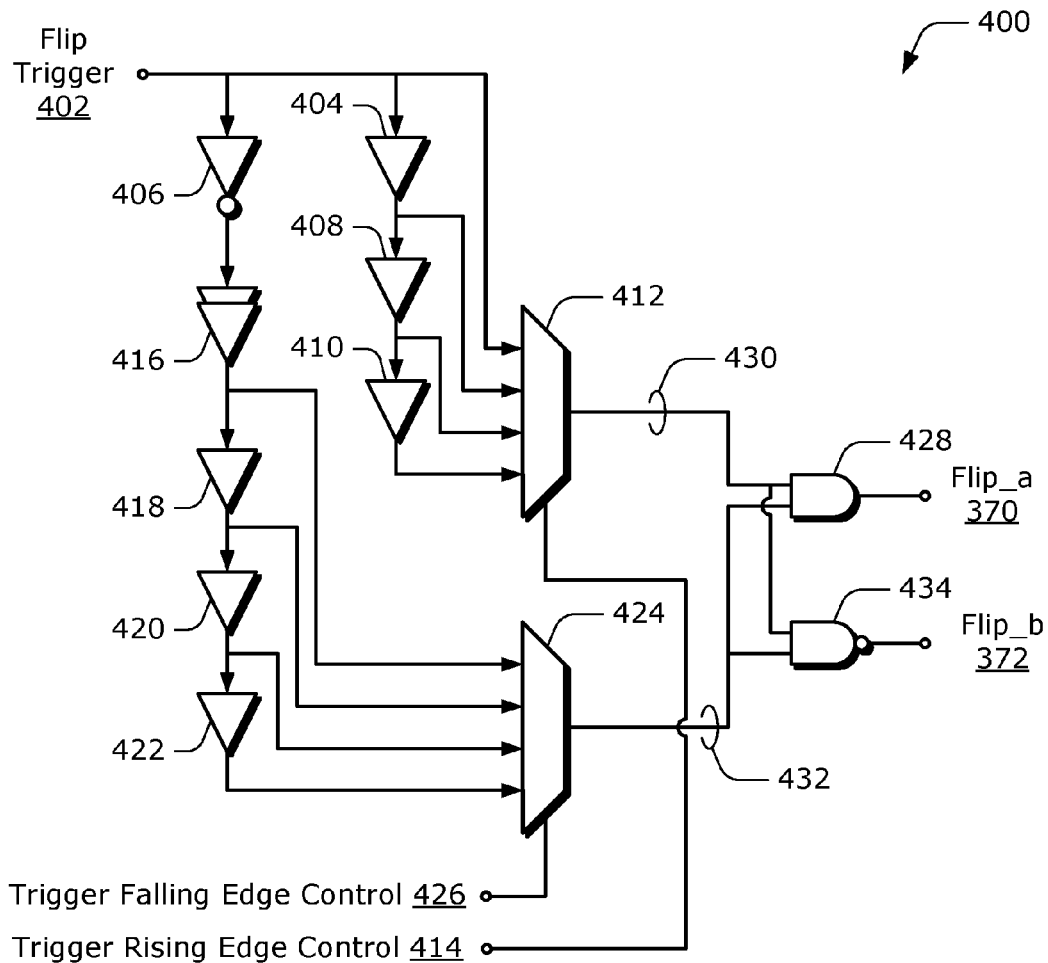
FIG. 4 illustrates an example circuit for generating a phase flip signal in accordance with one or more embodiments.
Figure 4:
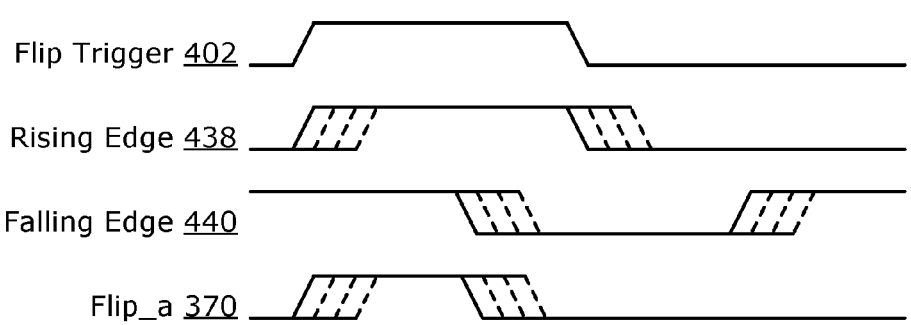

FIG. 4 illustrate an example circuit for generating a phase flip signal at 400, which is capable of providing a flip signal with selectable timing. In some cases, independent control of rising edge timing and falling edge timing is effective to reduce ambiguity of multiple phase shifts.

Flip trigger signal 402 is received at buffer 404 and inversion buffer 406, which inverts a wave form of flip trigger signal 402. Flip trigger signal 402 may be received from any suitable source, such as phase detector 210, modem baseband 120, a microcontroller, phase correction logic, and the like. Flip trigger signal 402 propagates through buffer 404 to buffer 408 and buffer 410, which are connected in series and have the respective outputs that are connected to inputs of multiplexor 412. Multiplexor 412 enables selection, via trigger rising edge control 414, of flip trigger signal 402 or one of three delayed flip trigger signals from the outputs of buffers 404, 408, or 410.

An inverted flip trigger signal 402 propagates through buffer 406 to buffer(s) 416 through 422, which are connected in series and have respective outputs that are connected to inputs of multiplexor 424. Multiplexor 424 enables selection, via trigger falling edge control 426, of one of four inverted and delayed flip trigger signals from the outputs of buffers 416 through 422.

An AND gate 428 receives selected flip trigger signal 430 from an output of multiplexor 412 and selected inverted flip trigger signal 432 from an output of multiplexor 424 to provide phase flip signal 370 (flip_a). NAND gate 434 also receives selected flip trigger signal 430 from the output of multiplexor 412 and selected inverted flip trigger signal 432 from the output of multiplexor 424 to provide alternate phase flip signal 372 (flip_b). In some cases, AND gate 428 and NAND gate 434 assure that assertion of phase flip signal 370 and alternate phase flip signal 372 is mutually exclusive to prevent concurrent activation of multiple sets of current paths within current steering circuitry 306. Alternately or additionally, alternate phase flip signal 372 can be provided by an inverter or other logic based on the outputs of multiplexors 412 and 424.

An example of controllable flip circuit timing is illustrated at 436, in which a timing diagram illustrates signals generated in response to assertion of flip trigger signal 402. As shown in the timing diagram, timing of rising edge signal 438 can follow that of flip trigger signal 402 or be delayed by selecting one of the signals provided by buffer 404, buffer 408, or buffer 410. Falling edge signal 440, which includes a base delay provided by any suitable number of buffers preceding buffer 416, has timing that is controllable by selecting one of the signals provided by buffers 416 through 422. The signals with selected timing are then combined by AND gate 428 to provide phase flip signal 370, the rising and falling edges of which are controllable as shown at 436.

Techniques of Current Steering Phase Control for CML Circuits

The following techniques of current steering phase control may be implemented using any of the previously described entities of the example environment or component. Reference to entities, such as local oscillator 128, frequency divider 208, phase-control circuitry 130, or phase detector 210, is made by example only and is not intended to limit the ways in which the techniques can be implemented. The techniques are described with reference to example methods illustrated in FIGS. 5, 6, and 8, which are depicted as respective sets of operations or acts that may be performed by entities described herein. The depicted sets of operations illustrate a few of the many ways in which the techniques may be implemented. As such, operations of a method may be repeated, combined, separated, omitted, performed in alternate orders, performed concurrently, or used in conjunction with another method or operations thereof.

Figure 5:
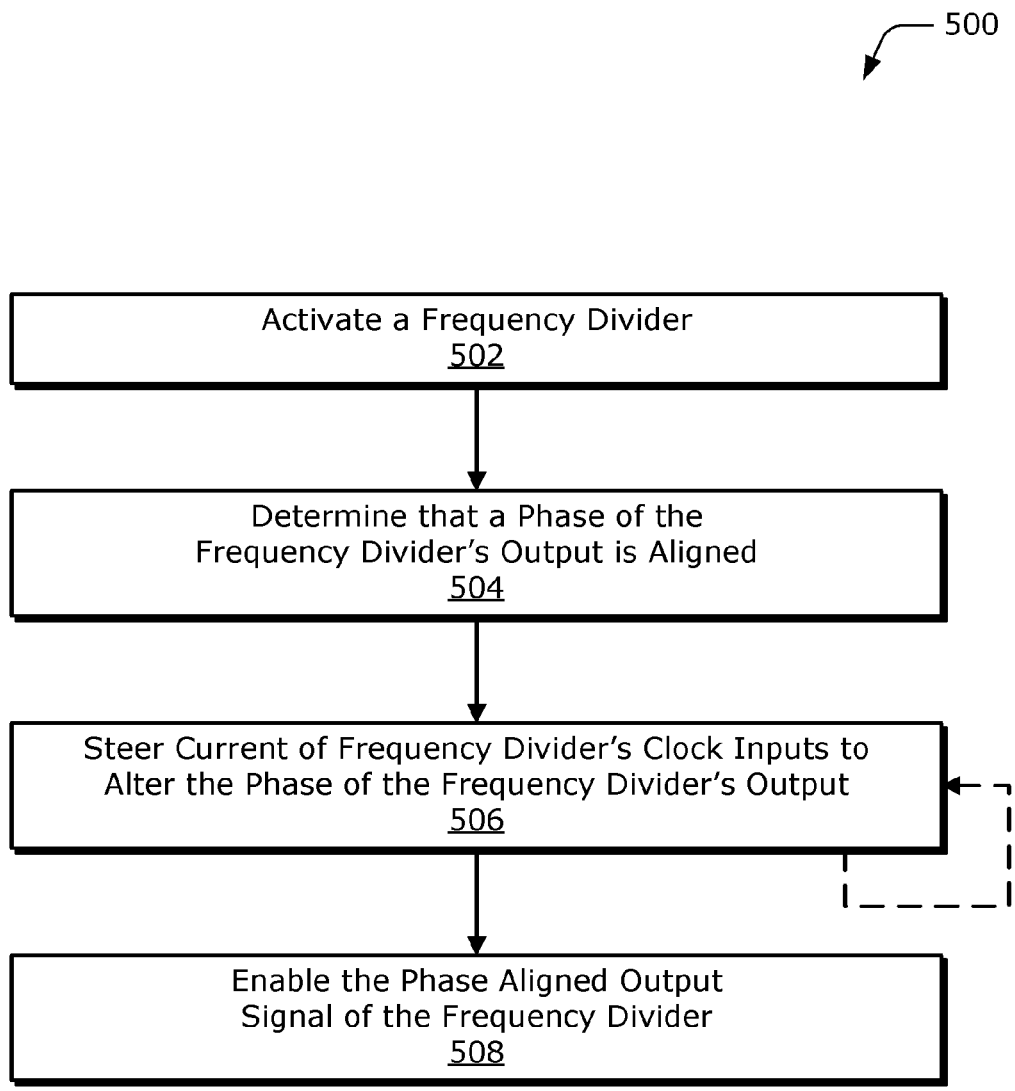
FIG. 5 illustrates an example method for altering a phase of a frequency divider's output.

FIG. 5 illustrates an example method 500 for altering a phase of a frequency divider's output. The operations described herein may be performed using any suitable circuitry or component, which may provide means for implementing one or more of the operations. In some cases, the operations are performed by an apparatus (e.g., phase detector) configured to detect and/or correct phase alignment. In such cases, instructions executed by a processor of the apparatus may cause the apparatus to perform the operations.

At 502, the method comprises activating a frequency divider. The frequency divider may be activated responsive to a transceiver being turned on or exiting a sleep state. In some cases, the frequency divider is activated or powered up to perform calibration operations, such as calibration of multiple transmit or receive chains. As previously discussed, a starting state of the frequency divider is unknown when activated. As such, a phase of the frequency divider's output can be uncertain or ambiguous once activated.

At 504, the method includes determining that a phase of the frequency divider's output is aligned. Phase alignment of the frequency divider's output may be determined relative to an input clock signal or an output of another frequency divider. For example, phase detector 210 can measure a phase of a frequency divider's differential output signal relative to another differential output signal of another frequency divider. In some cases, the phase of the frequency divider's output is out of phase from another frequency divider's output by 180 degrees.

At 506, the method includes steering current of the frequency divider's clock inputs to alter the phase of the frequency divider's output. This can be effective to flip or shift a phase of the input signal by 180 degrees. The current of the clock inputs may include current sank from respective tracking and latching branches of two or more latches of the frequency divider.

For example, applying (e.g., toggling) flip signal 370 or alternate flip signal 372 can change a phase of the respective current sank by clock input circuitry 302 through current-carrying branches 324 and 326 by 180 degrees. This can be effective to shift a phase of the current divider's output (e.g., $Q_N$ 338, $Q_P$ 340, $I_N$ 352, or $I_P$ 354) by 90 degrees. As such, steering the current may comprise multiple applications of phase flip signal 370 or alternate phase flip signal 372 to current steering circuitry 306 to achieve an output phase shift of 180 degrees or more. Optionally, operation 506 may be repeated until the phase of the frequency divider's output is aligned with that of another divider, an input clock signal, a phase reference signal, and the like.

At 508, the method includes enabling the phase aligned output signal of the frequency divider. The enabled phase-aligned output of the frequency divider can be used for calibration operations of a transceiver or to implement various communication functions, such as beam forming. In at least some cases, aligning the phase of the output is effective to prevent or reduce bi-modal DC offset in communication chains of a transceiver.

Figure 6:
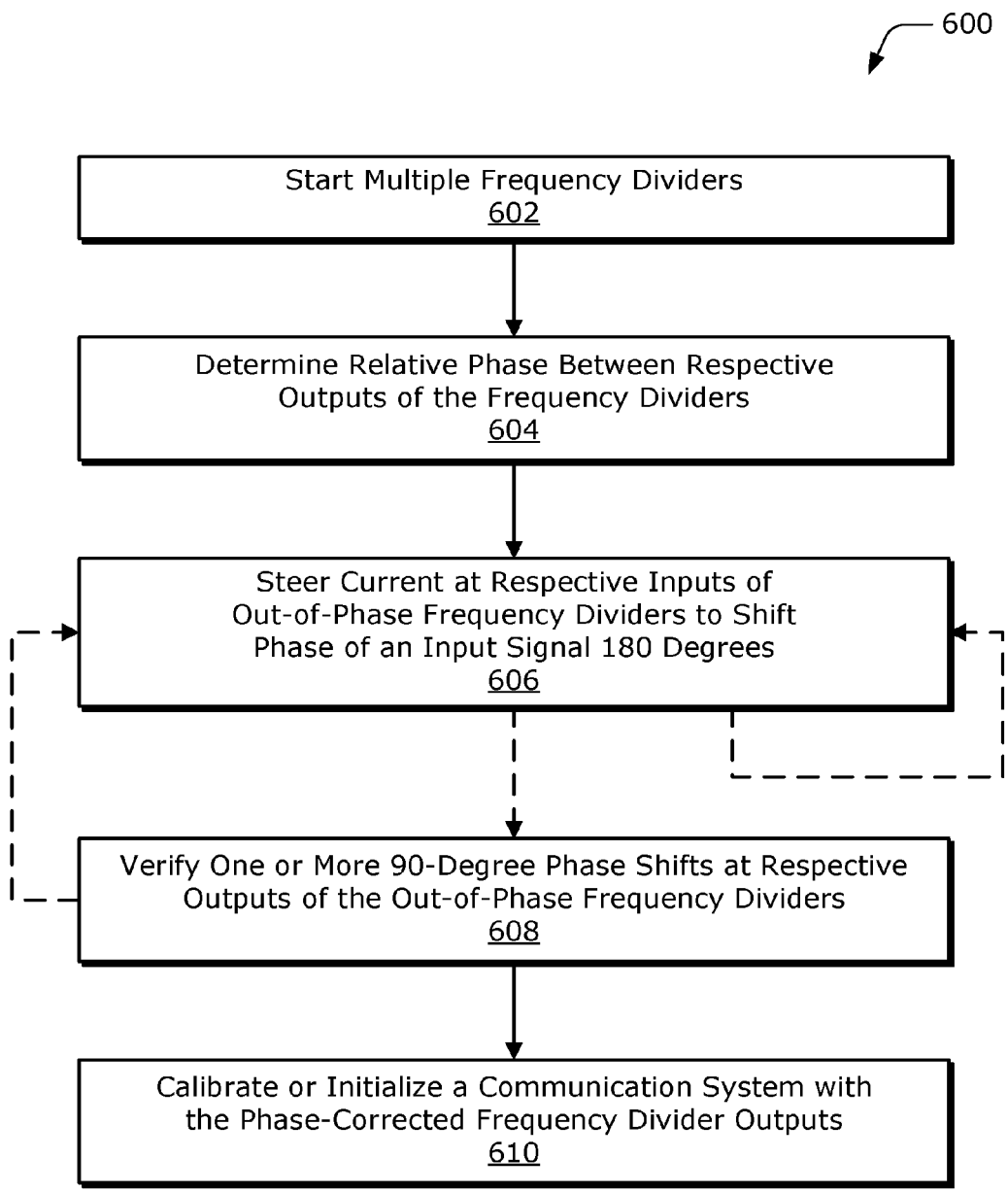
FIG. 6 illustrates an example method for shifting output phase of one or more frequency dividers.

FIG. 6 illustrates an example method 600 for shifting output phase of one or more frequency dividers. The operations described herein may be performed using any suitable circuitry or component, such as phase detector 210 or current steering circuitry 306.

At 602, the method includes starting multiple frequency dividers. Each of the multiple frequency dividers may be associated with a respective receive or transmit chain of a receiver. In some cases, the multiple frequency dividers are activated or powered up to perform calibration operations or enable signal processing functions of a transceiver.

At 604, the method includes determining relative phase between respective outputs of the frequency dividers. This may include detecting relative phase between the respective outputs and/or a phase reference signal, such as a local oscillator output. For example, phase detector 210 may detect relative phase between respective outputs of frequency dividers 208-1 through 208-$n$. Once relative phases are determined (or measured), phase detector 210 may determine which of frequency dividers 208-1 through 208-$n$ are out-of-phase (e.g., off by 180 degrees).

At 606, the method includes steering current at respective inputs of out-of-phase frequency dividers to shift phase of an input signal 180 degrees. This may include steering current of clock input circuitry to different respective tracking and latching branches of two or more latches of the frequency divider. For a divide-by-two frequency divider, shifting a phase of the input signal by 180 degrees can be effective to shift the phase of the output signal by 90 degrees. As such, operation 606 may be repeated to shift a phase of a frequency divider's output signal 180 degrees or more.

Figure 7:
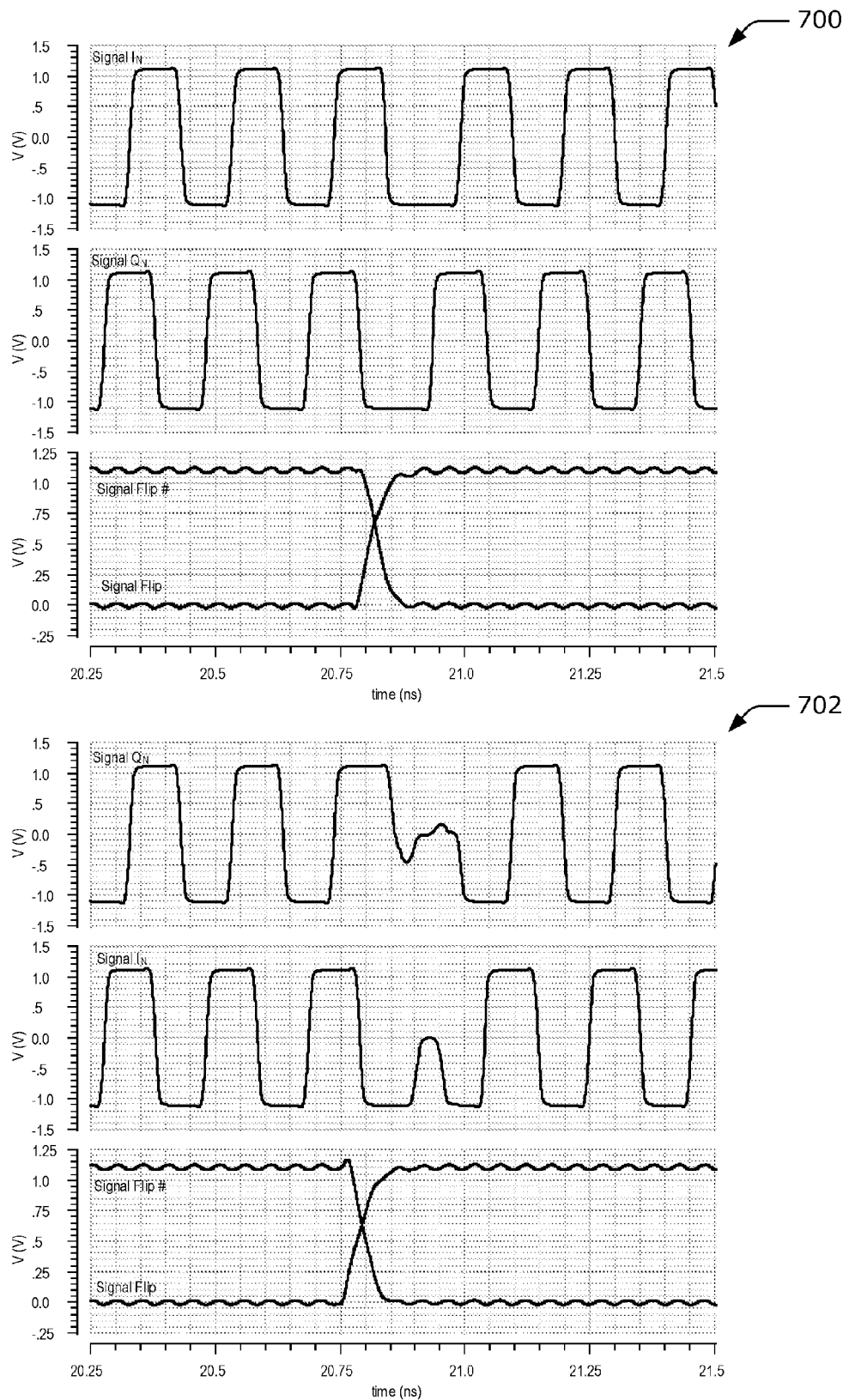
FIG. 7 illustrates example phase shifts of frequency divider output in accordance with one or more embodiments.

By way of example, consider FIG. 7, in which a flip signal and alternate flip signals are toggled to steer current between two current-carrying branches of a frequency divider. Depending on when the flip signals are toggled, a phase of the outputs may shift by either positive 90 degrees as shown at 700 or negative 90 degrees as shown at 702. Accordingly, the flip signals may be toggled multiple times to achieve a desired 180 degree phase shift, such as two positive 90-degree phase shifts or two negative 90-degree phase shifts.

At 608, the method includes verifying one or more 90-degree phase shifts at respective outputs of the out-of-phase frequency dividers. Because each phase shift of the output may be positive or negative, a combined amount of phase shift is verified at the outputs of the previously out-of-phase frequency dividers. For example, phase detector 210 may re-measure relative phase of a previously out-of-phase frequency divider to verify that phase of the output has shifted 180 degrees. If current steering operations fail to result in a desired amount of output phase shift, method 600 may return to operation 606 to implement additional current steering operations to implement the desired amount of output phase shift. In some cases, multiple iterations of operations 606 and 608 can be performed without degrading transceiver performance. In such cases, multiple iterations (e.g., up to 50) of current steering and phase verification may consume as few as 10 microseconds.

At 610, the method includes calibrating or initializing a communication system with the phase corrected frequency divider outputs. Once verified as phase corrected, the respective outputs of the phase-corrected frequency dividers can be used by signal processing components of the communication system, such as transmit or receive chains. In at least some cases, phase correction of the frequency divider outputs enable beam forming or other advanced communication schemes.

Figure 8:
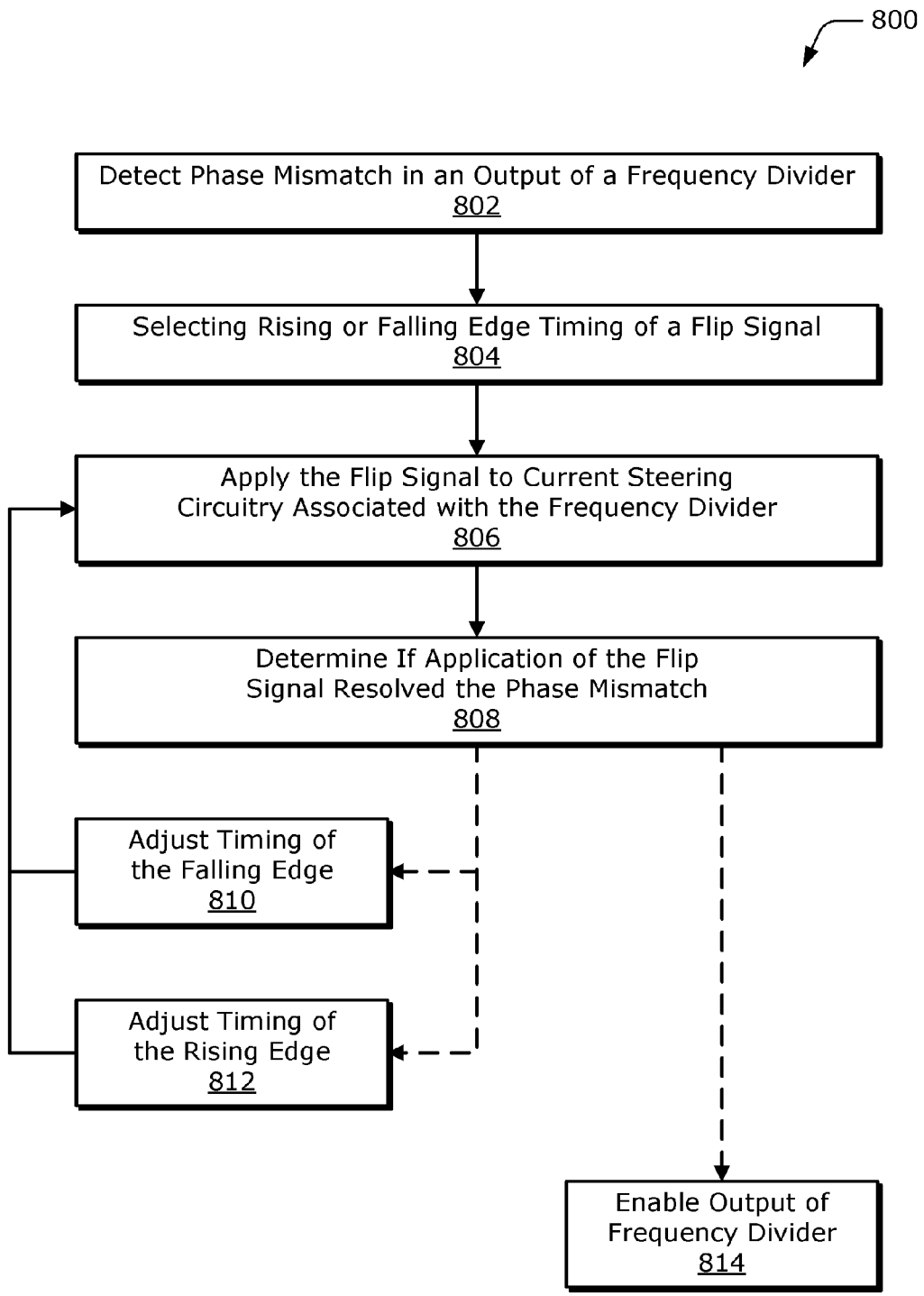
FIG. 8 illustrates an example method for altering output phase of a frequency divider with flip signal having variable edge timing.

FIG. 8 illustrates an example method 800 for altering output phase of a frequency divider with flip signal having variable edge timing. The operations described herein may be performed using any suitable circuitry or component, such as phase detector 210, current steering circuitry 306, or flip signal generating circuit 400.

At 802, the method includes detecting a phase mismatch in an output of a frequency divider. The output of the phase detector may be out of phase with one or more other frequency dividers.

At 804, the method includes selecting rising or falling edge timing of a flip signal. In some cases, selecting rising or falling edge timing enables toggling of a current steering control signal to occur in a same phase region of a clock period. In such cases, this can be effective to two consecutive phase changes at an output of the frequency divider. The rising and falling edge timing can be selected using any suitable means, such as by multiplexors 412 and 424 of flip signal circuit 400. In context of FIG. 4, trigger rising edge control 414 and trigger falling edge control 426 may each comprise two bit signal lines (e.g., <1:0>) that enable selection of up to four different edge timings.

At 806, the method includes applying the flip signal to current steering circuitry associated with the frequency divider. The flip signal is applied to the current steering circuitry based on the selected rising or falling edge timing. In some cases, the application of the flip signal is not synchronized with an input clock signal of the frequency divider.

At 808, the method includes determining if application of the flip signal resolved the phase mismatch in the output of the frequency divider. Determining if the phase mismatch is resolved may include measuring a phase of the output of the frequency divider relative to phase of another frequency divider's output. If the phase mismatch is not resolved by the application of the flip signal, method 800 may proceed to either operation 810 or operation 812. Alternately, if the phase mismatch is resolved, method 800 may proceed to operation 814.

At 810, the method includes adjusting timing of the falling edge of the flip signal. Adjusting the timing of the falling edge of the flip signal may include selecting falling edge timing from a differently delayed falling edge signal, such as those illustrated by falling edge signal 440. After adjusting the timing of the falling edge of the flip signal, method 800 may return to operation 806 to apply a flip signal with adjusted timing. In some cases, adjusting the falling edge timing of the flip signal is effective to cause two consecutive output phase shifts that result in a net amount of output phase shift.

At 812, the method includes adjusting timing of the rising edge of the flip signal. Adjusting the timing of the rising edge of the flip signal may include selecting rising edge timing from a differently delayed rising edge signal, such as those illustrated by rising edge signal 438. After adjusting the timing of the rising edge of the flip signal, method 800 may return to operation 806 to apply a flip signal with adjusted timing. In some cases, adjusting the rising edge timing of the flip signal is effective to cause two consecutive output phase shifts that result in a net amount of output phase shift.

In some cases, operations 810 and 812 are performed iteratively to cause the output of the frequency divider to shift or align. For example, each of the falling edge timing adjustments can be stepped through for a given rising edge timing. If stepping through the falling edge timing adjustments does not result in a phase shift of the output, another rising edge timing can be selected before re-stepping through the falling edge timing. Alternately or additionally, the stepping process may be reversed, in which each of the rising edge timing adjustments are stepped through for a given falling edge timing.

At 814, the method includes enabling output of the frequency divider. Once the output of the frequency divider is phase-aligned, the output can be enabled for use by a transmit or receive chain of a transceiver. In at least some cases, phase alignment of the frequency divider output enables beam forming or other advanced communication schemes.

Although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. A circuit for frequency division, the circuit comprising:
   a first current sink or a first current source connected to a first potential;
   a first current-carrying branch of frequency-dividing circuitry operably connected to a first load resistor;
   a second current-carrying branch of the frequency-dividing circuitry operably connected to a second load resistor, the first and second load resistors connected to a second potential;
   a first switch element connected between the current sink or the current source and the first current-carrying branch of the frequency-dividing circuitry; and
   a second switch element connected between the current sink or the current source and the second current-carrying branch of the frequency-dividing circuitry;
   a second current sink or a second current source connected to the first potential;
   a third switch element connected between the second current sink or the second current source and the first current-carrying branch of the frequency-dividing circuitry; and
   a fourth switch element connected between the second current sink or the second current source and the second current-carrying branch of the frequency-dividing circuitry.

2. The circuit as recited in claim 1, wherein the circuit comprises the first current sink.

3. The circuit as recited in claim 2, wherein a gate of the first switch element is connected to a gate of the fourth switch element and a gate of the second switch element is connected to a gate of the third switch element.

4. The circuit as recited in claim 1, wherein the circuit comprises the first current source.

5. The circuit as recited in claim 1, wherein:
   the first current-carrying branch of the frequency-dividing circuitry is operably connected to the first load resistor via a switch of the frequency-dividing circuitry; and
   the second current-carrying branch of the frequency-dividing circuitry is operably connected to the second load resistor via a switch of the frequency-dividing circuitry.

6. The circuit as recited in claim 1, wherein the first potential is a ground rail and the second potential is power rail.

7. The circuit as recited in claim 1, wherein the first potential is a power rail and the second potential is a ground rail.

8. The circuit as recited in claim 1, wherein a gate of the first current sink or the first current source is operably connected to a local oscillator, voltage controlled oscillator, or phase-locked loop circuit.

9. The circuit as recited in claim 1, wherein the first and second switch elements are configured to steer current sank by the first current sink or sourced by the first current source through either the first current-carrying branch or the second current-carrying branch to control a phase of a signal provided by the frequency-dividing circuitry.

10. The circuit as recited in claim 9, wherein steering the current sank by the first current sink or sourced by the first current source through the first current-carrying branch or the second current-carrying branch is effective to shift a phase of current applied to the frequency-dividing circuitry by one-hundred and eighty (180) degrees.

11. The circuit as recited in claim 9, wherein steering the current sank by the first current sink or sourced by the first current source through the first current-carrying branch or second current-carrying branch is effective to shift a phase of the signal provided by the frequency-dividing circuitry by ninety (90) degrees.

12. The circuit as recited in claim 1, wherein one or more of the first current sink, first current source, switch elements, and frequency-dividing circuitry is implemented via p-type or n-type metal-oxide-semiconductor field-effect transistors (MOSFETs).

13. The circuit as recited in claim 1, wherein the circuit is embodied as at least part of a receiver, transmitter, transceiver, clock signal generator, modulator, demodulator, signal mixer, or frequency synthesizer.

14. A frequency division circuit comprising:
   first current-mode logic (CIVIL) latch circuitry having outputs connected to a first potential via a first set of resistors;
   second CIVIL latch circuitry having inputs connected to the outputs of the first CML latch circuitry and outputs connected to the first potential via a second set of resistors, the outputs of the second CML latch circuitry connected to inputs of the first CIVIL latch circuitry;
   a first CML clock input having a terminal connected to a second potential;
   a second CIVIL clock input having a terminal connected to the second potential;

a first set of switch elements comprising a first switch element interposed between another terminal of the first CIVIL clock input and the first CML latch circuitry, and a second switch element interposed between another terminal of the second CIVIL clock input and the second CIVIL latch circuitry; and a second set of switch elements comprising a third switch element interposed between the other terminal of the first CIVIL clock input and the second CML latch circuitry, and a fourth switch element interposed between the other terminal of the second CML clock input and the first CML latch circuitry.

15. The frequency division circuit as recited in claim 14, wherein a gate of the first switch element is connected to a gate of the second switch element or a gate of the third switch element is connected to a gate of the fourth switch element.

16. The frequency division circuit as recited in claim 14, wherein:

the first set of switch elements steers current sank or sourced by the first CIVIL clock input through the first CIVIL latch circuitry and current sank or sourced by the second CML clock input through the second CIVIL latch circuitry; and the second set of switch elements steers the current sank or sourced by the first CML clock input through the second CIVIL latch circuitry and current sank or sourced by the second CML clock input through the first CML latch circuitry.

17. The frequency division circuit as recited in claim 14, wherein the first potential is higher than the second potential.

18. The frequency division circuit as recited in claim 14, wherein the first potential is lower than the second potential.

19. The frequency division circuit as recited in claim 14, wherein respective gates of the first and second CML clock inputs are connected to a local oscillator from which a differential signal is received.

20. The frequency division circuit as recited in claim 19, wherein the differential signal is a first differential signal having a first frequency, the outputs of the first CML latch circuitry provide a second differential signal having a second frequency, and the outputs of the second CIVIL latch circuitry provide a third differential signal having the second frequency.

21. The frequency division circuit as recited in claim 20, wherein the second and third differential signals vary by approximately ninety (90) degrees.

22. The frequency division circuit as recited in claim 19, further comprising a capacitor interposed between at least one of the respective gates of the first CML clock input or the second CML clock input and the local oscillator.

23. The frequency division circuit as recited in claim 14, further comprising a resistor interposed between at least one of respective gates of the first CIVIL clock input or the second CIVIL clock input and a third potential.

24. A circuit for frequency division, the circuit comprising:

a first current-mode logic (CIVIL) latch having a first latching branch, a first tracking branch with outputs connected to first load resistors, and first clock inputs connected to a ground rail and first clock branches;

a second CML latch having a second latching branch, a second tracking branch with outputs connected to second load resistors, and second clock inputs connected to a ground rail and second clock branches;

first switch elements connected from each of the first clock branches to the first latching and tracking branches of the first CML latch; and second switch elements connected from each of the second clock branches to the second latching and tracking branches of the second CML latch.

25. The circuit as recited in claim 24, wherein the circuit further comprises:

multiple buffers to connected in series; and a multiplexor having multiple inputs that are each connected to an output of a respective one of the multiple buffers and an output connected to at least two respective control gates of the first switch elements or the second switch elements.

26. The circuit as recited in claim 24, wherein the circuit further comprises phase-control circuitry to which respective control gates of the first and second switch elements are connected, the phase-control circuitry comprising:

a first set of buffers to provide multiple respective rising edges for a current-steering signal;

a second set of buffers to provide multiple respective falling edges for the current-steering signal;

a first multiplexor having multiple inputs that are each connected to an output of a respective one of the first set of buffers, a selection input to enable selection of one of the multiple respective rising edges, and an output to provide the selected rising edge for the current steering signal;

a second multiplexor having multiple inputs that are each connected to an output of a respective one of the second set of buffers, a selection input to enable selection of one of the multiple respective falling edges, and an output to provide the selected falling edge for the current steering signal; and an AND gate having inputs connected to the respective outputs of the first and second multiplexors, and an output of the AND gate connected to the control gates of at least two of the first and second switch elements.

27. The circuit as recited in claim 26, wherein the phase-control circuitry further comprises a NAND gate having inputs connected to the respective outputs of the first and second multiplexors, and an output of the NAND gate connected to the control gates of at least two others of the first and second switch elements.

28. The circuit as recited in claim 24, wherein one of the first clock branches and one of the second clock branches are implemented as a shared clock branch operably connected to the first and second CIVIL latches via at least two of the first and second switch elements.

29. The circuit as recited in claim 24, wherein the outputs of the first CIVIL latch are connected to inputs of the second CML latch and the outputs of the second CML latch are connected to inputs of the first CML latch.

30. A circuit for frequency division, the circuit comprising:

a first current sink connected to a ground rail;

a first current-carrying branch of frequency-dividing circuitry operably connected to a first load resistor;

a second current-carrying branch of the frequency-dividing circuitry operably connected a second load resistor, the first and second load resistors connected to a power rail;

first means interposed between the first current sink and the first current-carrying branch to selectively connect the current sink to the first current-carrying branch; and second means interposed between the first current sink and the second current-carrying branch to selectively connect the current sink to the second current-carrying branch;

a second current sink connected to the ground rail;

third means interposed between the second current sink and the first current-carrying branch to selectively connect the second current sink to the first current-carrying branch; and fourth means interposed between the second current sink and the second current-carrying branch to selectively connect the second current sink to the second current-carrying branch.

\* \* \* \* \*